(12) United States Patent
Calvert

(10) Patent No.: US 9,939,503 B2
(45) Date of Patent: Apr. 10, 2018

(54) METHOD AND APPARATUS FOR REDUCTION OF GRADIENT COIL VIBRATION IN MRI SYSTEMS

(71) Applicant: SIEMENS PLC, Camberley (GB)

(72) Inventor: Simon James Calvert, Oxfordshire (GB)

(73) Assignee: Siemens Healthcare Limited, Camberley (GB)

( * ) Notice: Subject to any disclaimer, the term of this patent is extended or adjusted under 35 U.S.C. 154(b) by 482 days.

(21) Appl. No.: 14/410,691

(22) PCT Filed: May 29, 2013

(86) PCT No.: PCT/EP2013/061129
§ 371 (c)(1),
(2) Date: Dec. 23, 2014

(87) PCT Pub. No.: WO2014/001014
PCT Pub. Date: Jan. 3, 2014

(65) Prior Publication Data
US 2015/0369888 A1 Dec. 24, 2015

(30) Foreign Application Priority Data
Jun. 26, 2012 (GB) .................................. 1211345.2

(51) Int. Cl.
*H01F 6/00* (2006.01)
*G01R 33/385* (2006.01)
(Continued)

(52) U.S. Cl.
CPC ..... *G01R 33/3854* (2013.01); *G01R 33/3815* (2013.01); *H01F 6/06* (2013.01)

(58) Field of Classification Search
CPC ....... H01F 6/06; G01R 33/20; G01R 33/3815; G01R 33/3854; G01V 3/00
(Continued)

(56) References Cited

U.S. PATENT DOCUMENTS 5,018,359 A * 5/1991 Horikawa ............. F25D 19/006
248/636
5,793,210 A * 8/1998 Pla ....................... G01R 33/3854
324/318

(Continued)

FOREIGN PATENT DOCUMENTS

| GB | 2488102 A | 8/2012 |
|---|---|---|
| JP | 2002-52004 A | 2/2002 |
| JP | 2005034267 A | 2/2005 |

*Primary Examiner* — Shawki S Ismail
*Assistant Examiner* — Lisa Homza
(74) *Attorney, Agent, or Firm* — Schiff Hardin LLP

(57) ABSTRACT

A cylindrical superconducting magnet system for use in magnetic resonance imaging has axially aligned primary superconducting coils surrounded by a thermal radiation shield within a vacuum vessel. A gradient coil assembly is axially aligned with and located radially within the primary superconducting coils. An assembly support is, radially positioned outside of the primary superconducting coils and is mechanically attached to the gradient coil assembly at a number of locations around the circumference of the gradient coil assembly, and at a number of axial locations along the gradient coil assembly, by radially-directed mechanical attachments that pass though through-holes through the vacuum vessel and the thermal radiation shield, and mechanically isolated from the vacuum vessel. At least some of the mechanical attachments each comprise an active force transducer arranged to provide impulses of force onto a surface of the gradient coil assembly to oppose vibrations of the gradient coil assembly.

27 Claims, 5 Drawing Sheets

(51) Int. Cl.
*G01R 33/3815* (2006.01)
*H01F 6/06* (2006.01)

(58) Field of Classification Search
USPC .......................................................... 335/216
See application file for complete search history.

(56) References Cited

U.S. PATENT DOCUMENTS

| | | | |
|---|---|---|---|
| 6,043,653 A * | 3/2000 | Takamori | G01R 33/3854 324/300 |
| 6,157,276 A * | 12/2000 | Hedeen | G01R 33/3854 324/318 |
| 6,437,568 B1 * | 8/2002 | Edelstein | G01R 33/3854 324/309 |
| 6,549,010 B2 | 4/2003 | Roozen et al. | |
| 6,552,543 B1 * | 4/2003 | Dietz | G01R 33/3854 324/318 |
| 6,556,012 B2 | 4/2003 | Yamashita | |
| 6,954,068 B1 * | 10/2005 | Takamori | G01R 33/3854 324/318 |
| 7,026,815 B2 * | 4/2006 | Harvey | G01R 33/3806 324/318 |
| 7,224,166 B2 | 5/2007 | Harvey et al. | |
| 8,253,416 B2 * | 8/2012 | Ma | G01R 33/3403 324/309 |
| 8,934,950 B2 * | 1/2015 | Wang | G01R 33/3815 505/162 |
| 2001/0022515 A1 * | 9/2001 | Yamashita | G01R 33/3854 324/300 |
| 2003/0179060 A1 | 9/2003 | Wang et al. | |
| 2004/0178792 A1 * | 9/2004 | Edelstein | G01R 33/3854 324/318 |
| 2007/0001792 A1 * | 1/2007 | Nemoto | G01R 33/3815 335/216 |
| 2007/0120631 A1 * | 5/2007 | Hobbs | G01R 33/28 335/216 |
| 2007/0146107 A1 * | 6/2007 | Lvovsky | G01R 33/3806 335/296 |
| 2008/0024254 A1 * | 1/2008 | Chiba | G01R 33/3804 335/216 |
| 2010/0033186 A1 | 2/2010 | Overweg et al. | |
| 2010/0225321 A1 * | 9/2010 | Kruip | G01R 33/3854 324/318 |
| 2010/0226058 A1 * | 9/2010 | Blakes | G01R 33/288 361/143 |
| 2012/0075045 A1 * | 3/2012 | Calvert | G01R 33/3804 335/216 |
| 2012/0202697 A1 * | 8/2012 | Calvert | G01R 33/3858 505/163 |
| 2013/0157865 A1 * | 6/2013 | Shen | G01R 33/3804 505/162 |
| 2014/0232398 A1 * | 8/2014 | Aley | G01R 33/3873 324/309 |
| 2014/0235448 A1 * | 8/2014 | Aley | G01R 33/387 505/162 |
| 2014/0274722 A1 * | 9/2014 | Calvert | G01R 33/3815 505/163 |

* cited by examiner

METHOD AND APPARATUS FOR REDUCTION OF GRADIENT COIL VIBRATION IN MRI SYSTEMS

BACKGROUND OF THE INVENTION

Field of the Invention

The present invention relates to magnetic resonance imaging (MRI) systems and in particular to arrangements for reducing the vibrations of gradient coil assemblies.

Description of the Prior Art

As is well known in the art, a typical MRI system comprises a superconducting main magnet which generates a strong, constant background field with a homogeneous region which contains an imaging region. Gradient coils are provided to generate oscillating orthogonal magnetic fields in the imaging region, which cause resonance of atomic spins of atoms within an imaging target, typically a human patient.

The interaction of the oscillating magnetic fields generated by the gradient coils with the constant background field causes strong mechanical vibrations of the gradient coil assembly, in turn causing unpleasant and disturbing noise for a patient.

FIG. 1 shows a radial cross-section through a typical magnet system for use in an MRI imaging system. A cylindrical magnet 10, typically comprising superconducting coils mounted on a former or other mechanical support structure, is positioned within a cryostat, comprising a cryogen vessel 12 containing a quantity of liquid cryogen 15, for example helium, which holds the superconducting magnet at a temperature below its transition temperature. The magnet is essentially rotationally symmetrical about axis A-A. The term "axial" is used in the present document to indicate a direction parallel to axis A-A, while the term "radial" means a direction perpendicular to axis A-A, in a plane which passes through the axis A-A. The direction z is the direction along the axis A-A; the direction x is the vertical radial direction and the direction y is the horizontal radial direction.

The cryogen vessel 12 is itself cylindrical, having an outer cylindrical wall 12a, an inner cylindrical bore tube 12b, and substantially planar annular end caps (not visible in FIG. 1). A vacuum vessel 14 surrounds the cryogen vessel. It also is itself cylindrical, having an outer cylindrical wall 14a, an inner cylindrical bore tube 14b, and substantially planar annular end caps (not visible in FIG. 1). A hard vacuum is provided in the volume between the vacuum vessel 14 and the cryogen vessel 12, providing effective thermal insulation. A thermal radiation shield 16 is placed in the evacuated volume. This is typically not a fully closed vessel, but is essentially cylindrical, having an outer cylindrical wall 16a, an inner cylindrical bore tube 16b, and substantially planar annular end caps (not visible in FIG. 1). The thermal radiation shield 16 serves to intercept radiated heat from the vacuum vessel 14 before it reaches the cryogen vessel 12. The thermal radiation shield 16 is cooled, for example by an active cryogenic refrigerator 17, or by escaping cryogen vapour.

In alternative arrangements, the magnet is not housed within a cryogen vessel, but is cooled in some other way: either by a low cryogen inventory arrangement such as a cooling loop, or a 'dry' arrangement in which a cryogenic refrigerator is thermally linked to the magnet. In 'dry' configurations, heat loads on the magnet are not directly cooled by liquid cryogens but, instead, are removed via a thermal link connected to a cooling pipe or refrigerator. Such heat-loads can result, for instance, from current ramping or gradient coil operation.

The vacuum vessel bore tube 14b must be mechanically strong and vacuum tight, to withstand vacuum loading both radially and axially. Conventionally, it is made of stainless steel. The cryogen vessel bore tube 12b, if any, must be strong and capable of withstanding the pressure of cryogen gas within the cryogen vessel. Typically, this is also of stainless steel. The bore tube 16b of the thermal radiation shield 16 must be impervious to infra-red radiation. It is preferably lightweight and a good conductor of heat. It is typically made of aluminium.

The present invention may be applied in all such cases.

In order to provide an imaging capability, a set of gradient coils 20 are provided within a gradient coil assembly 22 mounted within the bore of the superconducting magnet. A gradient coil assembly usually comprises a hollow cylindrical, resin-impregnated block, containing coils which generate orthogonal oscillating magnetic field gradients in three dimensions.

During an imaging procedure, the gradient coils 20 generate rapidly oscillating magnetic fields with very fast rise-times of typically just a few milliseconds. Stray fields from the gradient coils generate eddy currents in metal parts of the cryostat, in particular in metal bore tubes 14b, 16b, 12b of vacuum vessel, thermal shield and cryogen vessel, and also in the structure of the magnet 10. The eddy currents produced in the material of the vacuum vessel 14 will help to shield the thermal radiation shield 16 and cryogenically cooled components such as cryogen vessel bore tube 12b, magnet coils and magnet former 10 from stray fields from the gradient coils 20. However, because of the constant background magnetic field produced by the magnet, those eddy currents produce Lorentz forces, acting radially and axially and resulting in mechanical vibrations in the bore tube of the vacuum vessel. Further mechanical vibrations result from mechanical vibration of the gradient coil assembly itself, caused by Lorenz forces acting on the conductors of the gradient coil assembly 22 which carry significant rapidly alternating currents. Mechanical vibration of the gradient coil assembly due to Lorenz forces acting on the conductors within the gradient coil assembly also causes noise by direct vibration of air within the bore.

These mechanical vibrations, in the constant background magnetic field of the magnet 10, will in turn induce secondary eddy currents in conductive materials, such as the bore tube 16b of the thermal radiation shield, or the bore tube 12b of a cryogen vessel. The secondary eddy currents will of course generate magnetic fields, known as secondary magnetic fields. These can interfere with imaging, and also produce mechanical vibrations and secondary stray fields. The secondary stray fields also induce tertiary eddy currents in nearby conductive surfaces. These tertiary eddy currents will, in turn, generate tertiary magnetic fields, and so on. By this mechanism, the gradient coil is able to deposit significant heat energy in the magnet and/or surrounding cryogen vessel. Steps should therefore be taken to limit the vibration of the gradient coil itself. It is also desirable to reduce the amplitude of vibration of the gradient coil so that the noise and vibration experienced by the patient during imaging is reduced.

The bore tube 16b of the thermal radiation shield 16 is preferably thermally and electrically conductive to provide electromagnetic shielding of the magnet from the gradient coils.

A particular difficulty arises when, as is typical, the frequency of oscillation of the gradient magnetic fields is close to the resonant frequency of the bore tubes. It is known that a number of concentric bore tubes of similar diameters, such as the bore tubes of the vacuum vessel, thermal radiation shield and cryogen vessel of a typical MRI system, have similar effective resonant frequencies when made from common engineering materials as previously described.

The mechanical vibrations will be particularly strong when a resonant vibration frequency of a bore tube corresponds to the frequency of oscillation of the stray field. If the resonant frequencies of the vacuum vessel bore tube, thermal shield bore tube, cryogen vessel bore tube if any, and magnet components are close together, as is the case in current magnets, the bore tubes behave as a chain of closely coupled oscillators, and resonance bands will occur.

The oscillations may also interfere with the imaging process, causing detriment to the resulting images.

The resulting oscillations cause acoustic noise and vibration which is most unpleasant for a patient in the bore, as well as interfering with imaging and causing heating of cooled components such as the thermal radiation shield and cryogen vessel, if any.

The eddy currents induced in the cryogenically cooled components of the magnet constitute an ohmic heat load on the cryogenic cooling system, leading to an increased consumption of liquid cryogen where used, or an increased heat load on the cryogenic refrigerator. In dry magnets—those which are not cooled by a liquid cryogen—the increased heat load can result in a temperature rise of the coils, which can result in a quench.

Known approaches to this problem include the following. The gradient coil assembly 22 may be mounted to the vacuum vessel bore tube 14b using resilient mounts, wedges or air bags. These are intended to attenuate the mechanical oscillations of the gradient coil assembly. However, such arrangements do not completely prevent mechanical transmission of vibrations from the gradient coil to the vacuum vessel, and do very little to reduce the incidence of eddy currents in adjacent electrically conductive structures. It has been suggested to mount the gradient coil on to end frames, rather than to the vacuum vessel bore tube. However, such arrangements have required a lengthening of the system, which the present invention also seeks to avoid. Active force feedback actuators are suggested in U.S. Pat. No. 6,552,543, where actuators are placed within the vacuum vessel to oppose vibrations caused by stray fields from gradient coils. This solution is considered complex, and difficult to position the actuators between other components such as the magnet coils. Mode-compensated gradient coils have been suggested, in which primary and secondary conductors of the gradient coil assembly itself are optimised to reduce the amplitude of vibration of the gradient coil assembly. However, such optimisation makes it more difficult to achieve other important required gradient coil design objectives such as minimising the stray field.

Known approaches to similar problems have been set out in the following publications.

U.S. Pat. No. 6,552,543 B1 (Dietz et al., Siemens) discloses the use of mountings, including active mounts, between the gradient coil assembly and the cryostat.

U.S. Pat. No. 5,345,177 B2 (Sato et al, Hitachi) this discloses the use of radial-spoke gradient coil mountings incorporating soft pads.

U.S. Pat. No. 6,353,319 B1 (Dietz et al., Siemens) discloses mounting the gradient coil in the magnet bore, at points of maximum amplitude of mechanical vibrations, to disrupt resonant modes.

U.S. Pat. No. 7,053,744 B2 (Arz et al., Siemens) discloses a vacuum enclosure for the gradient coil.

U.S. Pat. No. 5,617,026 (Yoshino et. al, Hitachi) discloses the use of Piezo-transducers as a means of reducing the amplitude of gradient vibrations.

DE 10 2007 025 096 A1 (Dietz et al., Siemens) discloses a method of mode-compensation of a gradient coil.

To be effective in reducing vibration of the gradient coil assembly, the following issues must be addressed. Lorentz forces within the gradient coil should be compensated to avoid unbalanced loads in the gradient coil assembly which would tend to cause large amplitude vibrations resulting in high levels of acoustic noise and gradient coil induced heat load (GCIH). The effective flexural stiffness of the gradient coil assembly must be greatly increased, to reduce the amplitude of any vibrations, and to increase the resonant frequencies of the gradient coil assembly. The gradient coil assembly should be mechanically isolated from the cryostat to prevent direct excitation of vibrations in the vacuum vessel which generate increased noise. These issues should be addressed without causing any increase on the required diameter of the primary superconducting coils 30, or any reduction in available patient bore diameter.

SUMMARY OF THE INVENTION

The present invention accordingly provides methods and apparatus for reducing gradient coil vibration in MRI systems without increasing the vacuum vessel bore tube diameter. Conventional approaches to reducing gradient coil vibration include mechanical stiffening by the addition of stiffening elements to the gradient coil, but this approach is highly undesirable as it leads to an increase in gradient coil bore diameter, which in turn requires a consequent increase in the diameter of the superconducting coils, thus increasing the cost of the magnet significantly. In any case, it is believed that a doubling of the stiffness of the gradient coil assembly will only result in an approximately 1.4× increase in the resonant frequency.

The present invention aims to reduce the vibration of bore tubes subjected to oscillating gradient coil magnetic fields, by providing active force transducers which are controlled to apply forces to certain regions of the gradient coil assembly in opposition to resonant oscillations of the gradient coil assembly, thereby reducing the amplitude of those oscillations. The active force transducers themselves are placed radially outside of main magnet coils of an MRI system, and so do not require an increase in magnet coil diameter, or a reduction in available patient bore diameter, for their installation.

The reduced mechanical vibration of the gradient coil assembly leads to a reduction in acoustic noise from the gradient coil assembly; reduced eddy currents induced in nearby conductive surfaces, and so reduced heating of cryogenically cooled components.

DESCRIPTION OF THE PREFERRED EMBODIMENTS

Figure 1:
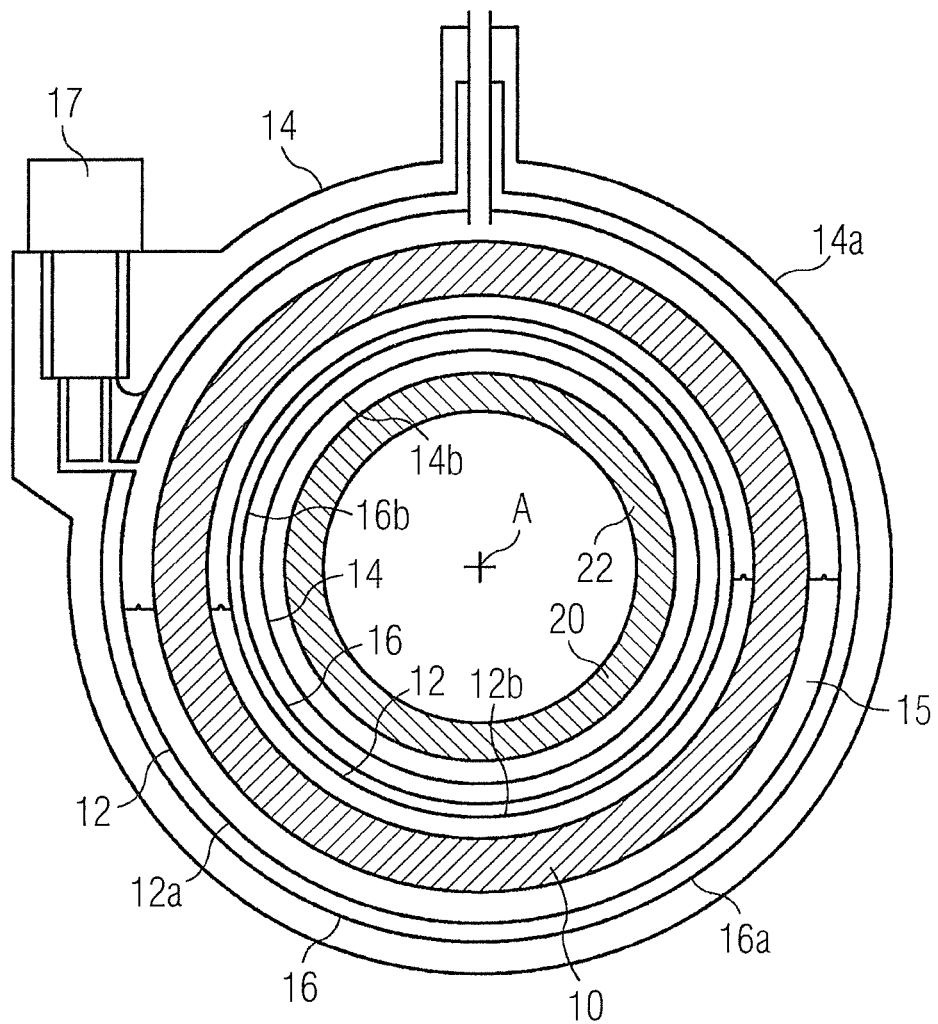
FIG. 1 shows a radial cross-section of a typical magnet system for use in an imaging system.

The present invention provides arrangements in which mechanical vibration of the gradient coil, and gradient coil induced heating (GCIH) resulting from operation of the gradient coil, are significantly reduced. Significantly, the present invention allows the reduction in mechanical vibration and GCIH to be achieved without reducing the available radial diameter of the bore of the gradient coil assembly, without increasing the diameter of superconducting coils and, in some embodiments, without increasing the length of the magnet system.

The present invention provides an arrangement for restraining mechanical vibration of the gradient coil assembly, and reducing transmission of mechanical vibrations from the gradient coil assembly to other components of the magnet system, by opposing such vibrations with active force transducers applied at selected positions on a surface of the gradient coil assembly.

The present invention provides methods and apparatus for force-balancing, or partially force-balancing, the gradient coil by using active force transducers, conventional in themselves. Relatively large, conventional, active force transducers may be used, with relatively slender mechanical supports, in the form of actuator rods, passing between primary superconducting coils.

The axial ends of the gradient coil assembly are most susceptible to vibration, and in certain embodiments, force transducers are only applied to selected positions near the axial ends of the gradient coil assembly. In some embodiments, mechanical support structures are provided only near axial ends of the cryostat. These 'end supports' do not significantly contribute to the stiffness of the gradient coil itself.

It is important to keep the bore of the gradient coil assembly as open as possible, as that bore size determines the diameter of the patient bore. Reduction in the diameter of the patient bore would result in reduced comfort for the patient, possibly resulting in spoilt imaging sequences, or patients being unable or unwilling to be imaged, due to the restricted volume available.

It is important to keep the length of the magnet system as short as possible, as an increase in length may increase or induce feelings of claustrophobia in patients, which may spoil imaging sequences, or cause patients to refuse to be imaged. Shorter magnets also require less space during transport and on site at the user's premises. The length of a magnet system is commonly used as a selling point, with shorter magnets being regarded as more desirable.

According to the present invention, a combination of features allows the objects of the invention to be achieved.

A radially outer mechanical support structure is provided, mechanically linked to the gradient coil assembly by active force transducers, but mechanically isolated from the cryostat.

The gradient coil structure is mechanically isolated from the cryostat structure to avoid mechanical excitation of vibrations in the vacuum vessel by mechanical vibrations of the gradient coil assembly. In certain embodiments of the present invention, the gradient coil is supported directly on the floor, having no contact with the cryostat structure.

Those parts of the vacuum vessel bore tube which are most subject to gradient coil stray fields—typically near the bore tube ends—may be stiffened or made of an electrically non-conductive material to reduce or eliminate the effects of eddy currents and secondary stray fields.

According to a feature of the present invention, a mechanical gradient coil assembly support is provided, radially outside of the gradient coil assembly and primary superconducting coils, linked to the gradient coil assembly by active force transducers 45.

Figure 2:
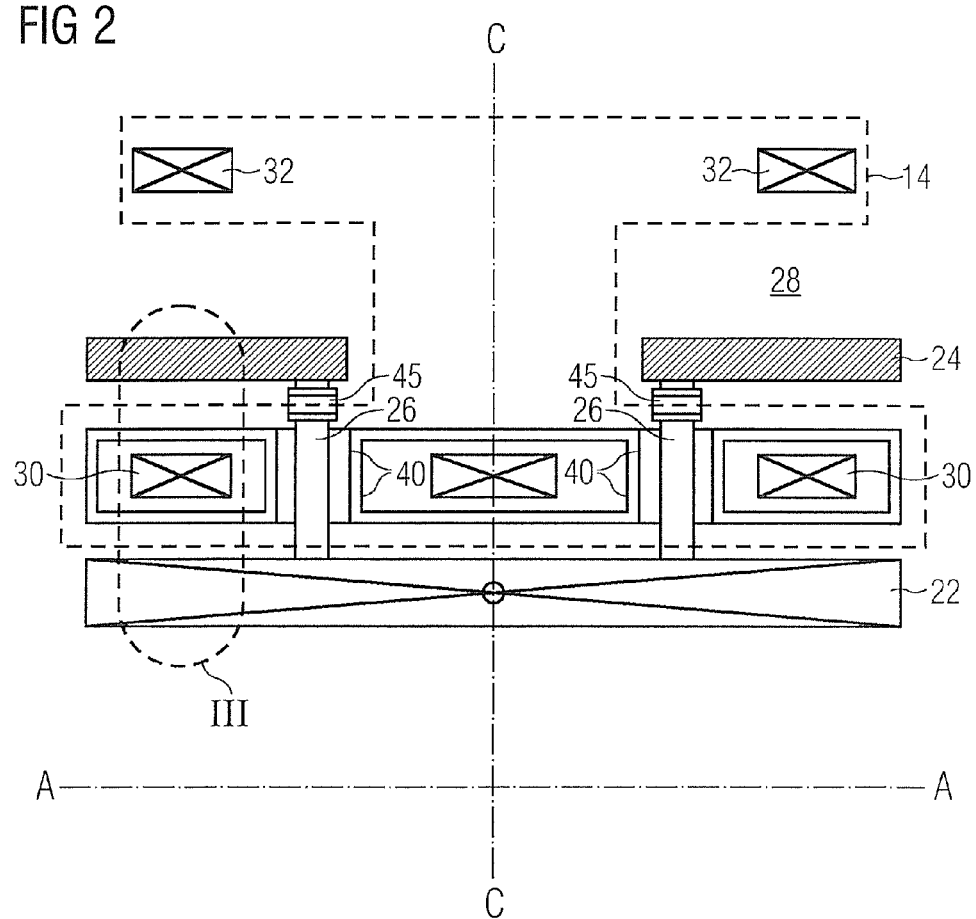
FIGS. 2-5 show schematic axial partial cross-sectional views of embodiments of the present invention.

FIG. 2 schematically illustrates a partial axial cross-section of a general gradient coil assembly arrangement according to an embodiment of the present invention, comprising a gradient coil assembly 22 and a gradient coil assembly support 24 mechanically linked to the gradient coil assembly 22 by a number of active force transducers 45. The structure of FIG. 2 is essentially rotationally symmetrical about axis A-A and has reflective symmetry about central plane C-C. The gradient coil assembly 22 and the assembly support 24 are not mechanically linked to the remainder of the structure. The gradient coil assembly support 24, in this example, comprises two annular structures, each positioned radially outside the gradient coil assembly near axial ends thereof. Each annular structure is mechanically attached 26 to the gradient coil assembly 22 by an active force transducer 45.

In this arrangement, vacuum vessel 14, shown dotted in the drawing, has an annular re-entrant portion defining a recess 28 in each annular end-cap. This re-entrant portion may usefully increase the stiffness of the end-cap, reducing its tendency to vibrate during imaging operations. The annular structures of the gradient coil assembly support 24 are located within this re-entrant portion. The superconducting magnet comprises primary superconducting coils 30, positioned within the vacuum vessel 14, radially inside the recess 28 and shield coils 32 positioned within the vacuum vessel, radially outside the recess 28. The shield coils 32 and primary coils 30 are mechanically supported and joined in any appropriate manner. The manner of mechanical support and joining of the primary superconducting coils and the secondary, shield, superconducting coils does not form part of the present invention, other than in that the mechanical attachments 26 linking the gradient coil assembly 22 to the gradient coil assembly support 24 pass though through-holes through the vacuum vessel, thermal radiation shield and any structure supporting and joining the primary coils 30 and the secondary, shield, coils 32.

The through-holes in the vacuum vessel and thermal radiation shield must of course be sealed with cross-tubes 40. In some embodiments, it may be found that the additional stiffness introduced by the presence of these cross-tubes 40 enables thinner materials to be used for the vacuum vessel and thermal shields, possibly enabling the diameter of the bore of the magnet, and so also of the gradient coil assembly and the patient bore, to be increased.

During imaging, the currents in the gradient coils are rapidly pulsed. The rapidly changing currents in the gradient coils, flowing in the background magnetic field of the superconducting coils 30, cause Lorenz forces to act on the gradient coil assembly and tend to cause mechanical vibrations. The present invention aims to reduce these mechanical vibrations by detecting such vibrations, or predicting them by computer-implemented simulation and controlling the active force transducers 45 to generate impulses of force of suitable magnitude and timing to oppose such vibration. In some embodiments, the active force transducers 45 may be piezoelectric transducers, controlled by applying a suitable voltage between radially outer and radially inner surfaces of a piezoelectric element. In other embodiments, the active force transducers 45 may be hydraulically or pneumatically operated, by applying a suitable fluid pressure to an interior volume of the transducer. Such transducers may be pistons within cylinders, or closed containers of resilient material which expand and contract in accordance with the applied fluid pressure.

Mechanical attachments 26 are coupled, by the force transducers 45, to a substantial structure, the gradient support assembly 24. This coupling will in itself tend to stiffen the gradient coil assembly 22 as well as providing a rigid reaction point for the force transducers 45. A further advantage of the present invention over the prior art is that the force transducers 45 are located in regions of relatively low magnetic field thus allowing a wider choice of transducer devices. Positioning of the transducer devices outside of the bore of the magnet also enables much larger and more capable devices to be used than in the prior art.

Figure 3:
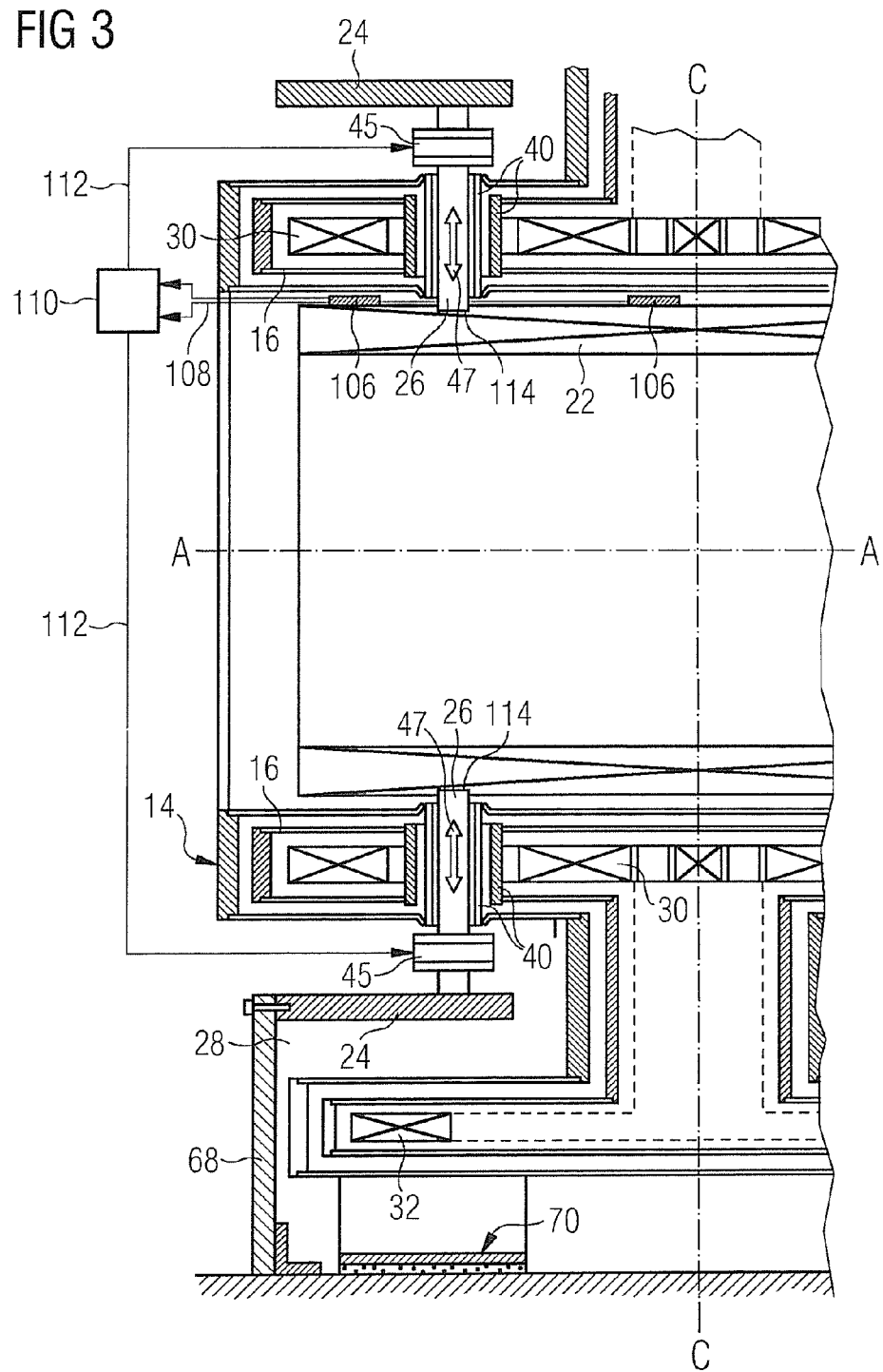

FIG. 3 shows a more complete partial axial cross-section of an embodiment of the present invention resembling the example shown in FIG. 2. The structure in FIG. 3 is essentially rotationally symmetrical about axis A-A, and essentially has reflectional symmetry about the centre plane marked C-C.

Cross-tubes 40 allow mechanical supports 26 to pass through the vacuum vessel 14 and the thermal radiation shield 16, while ensuring the functional integrity of both the vacuum vessel and the thermal radiation shield, yet avoiding any mechanical contact between the gradient coil assembly 22 and the vacuum vessel 14. The mechanical supports 26 comprise active force transducers 45, such as piezoelectric elements, pistons within cylinders, or closed containers of resilient material and are applied at selected positions on a surface of the gradient coil assembly.

Coils 30 of the primary superconducting magnet are mechanically supported and retained in required fixed relative positions by any suitable arrangement which allows cross-tubes 40 to pass radially between coils.

Superconducting shield coils 32 are mechanically supported and retained in position by any suitable arrangement which allows the provision of a re-entrant portion defining cavity 28 in the annular end caps of the vacuum vessel, sufficient for placement of assembly supports 24 and active force transducers 45. In some embodiments of the present invention, no superconducting shield coils are provided. The mechanical supports 26 comprising active force transducers 45 are placed at a number of locations around the circumference of the gradient coil assembly, and at a number of axial locations along the gradient coil assembly. Preferably, the mechanical supports are applied at or near antinodes of expected modes of vibration of the gradient coil assembly. By applying suitably timed force impulses at or near the antinodes of an expected or detected mode of vibration, the vibration may be opposed, and its amplitude limited or cancelled.

In operation, the gradient coil assembly will tend to vibrate, as mentioned above, due to the interaction of the oscillating magnetic fields it generates, and the background magnetic field provided by the superconducting primary coils 30. As the oscillating magnetic fields will oscillate in orthogonal directions x, y and z, it can be expected that the vibrations will also occur in orthogonal directions x, y and z. As used herein, x refers to vertical, z refers to axial, and y refers to a horizontal direction perpendicular to the axis A-A. By applying radial forces as shown at 47 to selected points on a surface of the gradient coil assembly, vibration in directions x and y may be opposed. That is, their amplitude may be reduced or cancelled.

Figure 4:
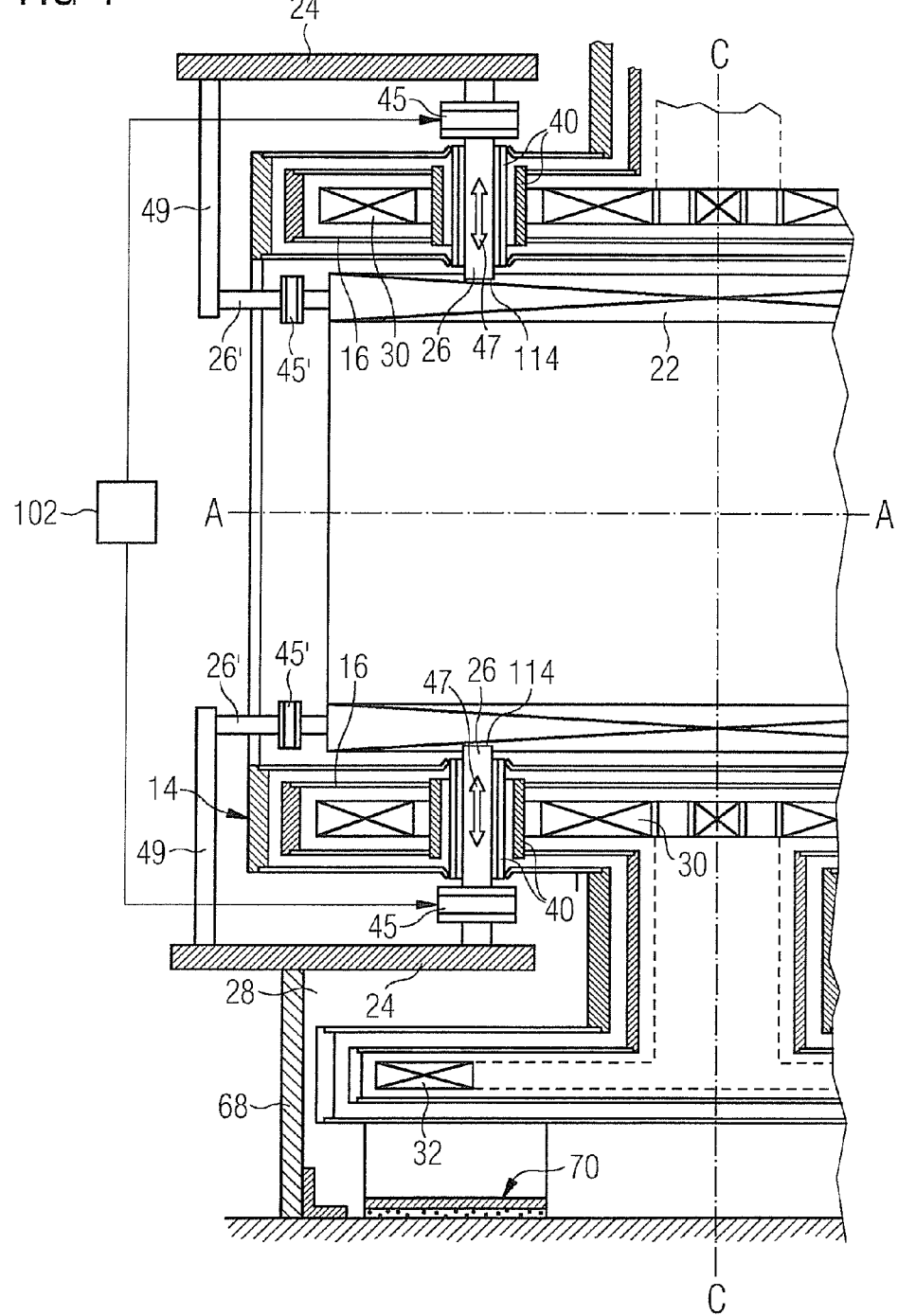

FIG. 4 illustrates another example embodiment of the present invention, similar to that of FIG. 3, but further equipped to oppose vibrations in the z direction. In addition to assembly supports 24 radially positioned outside of the magnet coils 30, end supports 49 are provided, mechanically linked to assembly supports 24 and extending radially inwards to support further mechanical supports 26', each comprising an active force transducer 45'. These further mechanical supports are each mounted between an end support 49 and an axial end of gradient coil assembly 22. The further mechanical supports 26' operate in a similar manner to that described for the mechanical supports 26, in that they apply suitably timed force impulses of suitable magnitude to selected positions on a surface of the gradient coil assembly in response to a measured or actual vibration of the gradient coil assembly, so as to oppose the vibrations, by reducing or cancelling their amplitude. As with active force transducers 45, the further active force transducers 45' may be electrically operated, such as piezoelectric transducers, or may be hydraulically or pneumatically operated, such as a piston in a cylinder or an expanding closed container of resilient material.

Figure 5:
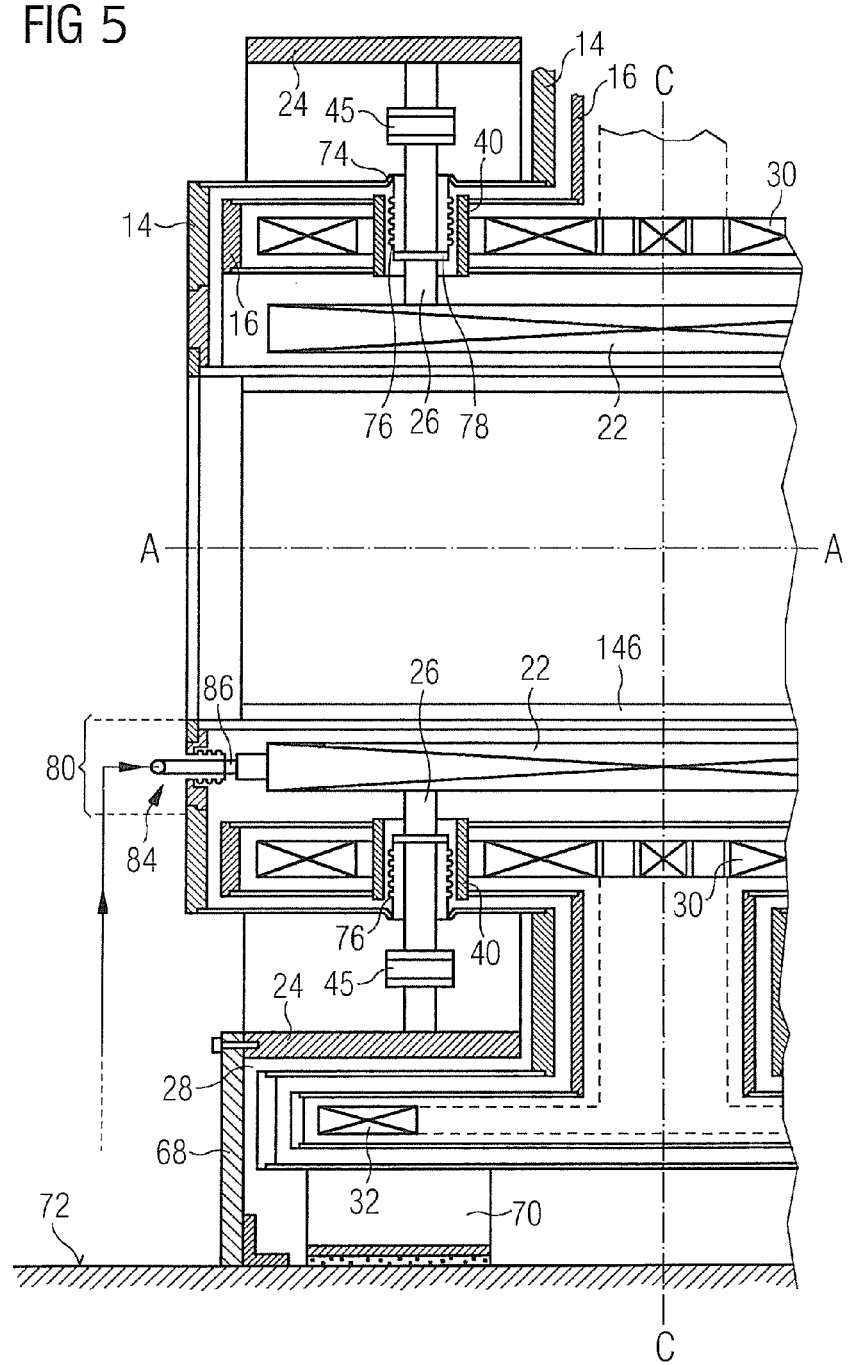

In some embodiments of the present invention, the gradient coil assembly is enclosed within the vacuum vessel, to prevent transmission of acoustic noise from the gradient coil assembly. FIG. 5 illustrates an example of such an embodiment. Features shown in FIG. 5 which correspond to features in other drawings carry corresponding reference numerals. The embodiment of FIG. 5 differs from the embodiment of FIG. 3 in that the gradient coil assembly 22 is located within the vacuum vessel 14, in the evacuated space between the vacuum vessel 14 and the thermal radiation shield 16. By accommodating the gradient coil assembly within a vacuum environment, no noise can be transmitted to the patient by vibration of air. The present invention reduces the mechanical vibration of the gradient coil assembly too, reducing the eddy currents induced in conductive surfaces of the assembly. The gradient coils assembly is almost completely mechanically decoupled from the vacuum vessel and the remainder of the assembly, being mounted on assembly supports 24 by mechanical supports 26 carrying active force transducers 45. A bellows 76 is provided around each mechanical support 26, to seal the vacuum vessel while minimising mechanical coupling between the gradient coil assembly 22 and the vacuum vessel 14. An RF or 'body' coil 146 is illustrated in this drawing. Such coil assemblies are provided in all MRI systems to receive signals from the oscillating atoms in the target.

Assembly supports 24 are positioned outside of the vacuum vessel, in the annular recess 28 described with reference to earlier embodiments. Assembly supports 24 are supported on a support surface 72, typically the ground, by ground support 68. The gradient coil assembly 22 is mechanically supported by the assembly support 24 through mechanical supports 26. In this embodiment, the mechanical supports pass through cross-tubes 40 within the thermal radiation shield 16. Mechanical supports 26 comprising active force transducers 45 must also pass from outside the vacuum vessel, where they interface with the support assembly 24, to within the vacuum vessel 14, where they interface with the gradient coil assembly 22.

In the illustrated embodiment, this is arranged by providing holes 74 in the vacuum vessel surface between the gradient coil assembly 22, and the assembly supports 24, and closing those holes with bellows arrangements 76, in this example each being closed by a closure member 78 sealed to the mechanical support 26. The bellows arrangements 76 allow the vacuum vessel to remain vacuum-tight, while absorbing mechanical vibrations from the gradient coil assembly and ensuring that these mechanical vibrations are not applied to the vacuum vessel.

Preferably, a part 80 of the end cap of the vacuum vessel is removable, to allow placement and replacement of the gradient coil 22. Of course, the part 80 can only be removed when the vacuum vessel is not evacuated. The presence of removable part 80 is of significant assistance when the vacuum vessel is being assembled around the primary superconducting coils 30. Preferably, in such arrangements, the vacuum vessel bore tube 14*b* is of an electrically non-conducting, non-magnetic material. An example of a suitable material is glass fibre impregnated with thermosetting resin. Such material does not suffer from eddy current generation, and is magnetically transparent so that is does not interfere with the gradient magnetic fields generated by the gradient coils. In such an arrangement, the vacuum vessel bore tube 14*b* will not suffer from Lorenz forces.

In order to provide the required electrical current to the gradient coil assembly, at least one current lead-through 84 is provided in the vacuum vessel, preferably in the removable part 80. The current lead-through is preferably connected to the vacuum vessel with a bellows 86 which serves to isolate the vacuum vessel from any mechanical vibration of the gradient coil assembly, while still enabling the vacuum vessel to remain vacuum-tight. The bellows may be closed by a closure member sealed to the current lead-through.

The gradient coil will heat up to ~80K and this will impose an increased heat-load on the thermal shield and therefore, indirectly, the magnet. However, this 'steady-state' heat-load is believed tolerable given that the much more severe dynamic element is much reduced due to the effective stiffening provided by the present invention. This arrangement offers effective acoustic noise reduction since all known transmission methods are eliminated or considerably reduced.

In a development of this embodiment, the apparatus of the present invention is further equipped to oppose vibrations in the z direction. In addition to assembly supports 24 radially positioned outside of the magnet coils 30, end supports 49 are provided, mechanically linked to assembly supports 24 and extending radially inwards to support axially-directed further mechanical supports, each comprising an active force transducer, as illustrated in and described with reference to FIG. 4.

In any of the embodiments of the invention, sensors 106, shown in FIG. 3, such as piezoelectric accelerometers may be attached to the gradient coil assembly to detect vibration of the gradient coil assembly. Signals 108 from these sensors may be provided to a magnet controller 110 which issues appropriate commands 112 to activate the active force transducers 45 to provide force pulses to selected locations 114 on a surface of the gradient coil assembly 22 with appropriate timing and magnitude. Depending on the type of active force transducers in use, the commands may be electrical signals directly applied to the active force transducers, for example where piezoelectric transducers are used, or impulses in pressure of a fluid may be generated to pneumatically- or hydraulically-operated active force transducers.

The magnet controller 110 controls a gradient power amplifier (not illustrated), to control the oscillating currents supplied to the gradient coils. The same controller can issue commands to activate the active force transducers 45 according to vibrations which can be expected to occur due to the application of the planned currents to the gradient coils. In such as arrangement, it is not necessary to measure vibrations of the gradient coil assembly. In an arrangement illustrated in FIG. 4, but applicable to all embodiments, the active force transducers 45 are controlled by signals supplied directly from a gradient coil amplifier 102, the power supply which provides alternating currents to the gradient coils.

The presence of mechanical supports 26, mounted between the gradient coil assembly 22 and gradient coil assembly support 24 will itself provide some mechanical stiffening of the gradient coil assembly. The mechanical supports 26 are preferably firmly attached to the gradient coil assembly, so that they can operate in tension as well and expansion, to exert radial forces as required in either direction, radially towards, or away from, the axis A-A.

As the active force transducers 45, 45' are located radially outside of the vacuum vessel, any active force transducers may be replaced without the need to warm the magnet to room temperature. For example, due to failure of a transducer, or a desire to upgrade to improved, likely larger, transducers. Such replacement of transducers is facilitated by placing transducers 45 in regions where no other equipment is close to the transducer. If transducers are used which do not contain magnetic material, such replacement may even be carried out with the magnet at field. The active force transducers do not need to operate within a vacuum, enlarging the range of possible types of actuator which may be employed. The gradient coil assembly 22 itself may be of conventional deign, other than in that it is preferably provided with mounting points of reinforcing material upon which the mechanical supports bear.

The example embodiment shown in FIG. 5 is intended to show several arrangements for limiting acoustic noise to the patient, and may be regarded as a preferred embodiment. By mounting the gradient coil assembly 22 within the vacuum region, no mechanical vibrations can be transmitted from the gradient coil assembly by mechanical vibration of air or gas. The stiffening arrangement of the present invention, using active force transducers 45, 45*a* independently of the vacuum vessel 14, magnet coils 30 or thermal radiation shield 16, reduces or eliminates direct mechanical vibration of the apparatus by the gradient coil assembly. The effect of the mounting arrangement of the present invention makes the gradient coil assembly appear much more stiff than could be achieved with a reasonable amount of mechanical reinforcement in the prior art. Preferably, the vacuum vessel bore tube 14*b* is formed of a non-magnetic material, such as fibreglass-reinforced resin (GRP), rather than a more conventional material such as stainless steel. In this way, the varying magnetic fields of the gradient coil assembly can be prevented from inducing oscillating eddy currents in the material of the bore tube. Such induced currents would interact with the steady background field to cause oscillation of the bore tube, and unpleasant acoustic noise. Similarly, the axial end pieces of the vacuum vessel 14, including removable part 80 are preferably made of a non-magnetic material such as GRP, rather than a more conventional material such as stainless steel, for the same reasons.

Ideally, reduction of noise and vibration of the gradient coil assembly involves two complementary, but competing, aspects. Firstly, the gradient coils should be actively shielded to reduce primary eddy currents from being induced in adjacent electrically conductive structures. Secondly, the Lorentz forces experienced by the gradient coils should be minimised. The methods described above are directed to the second of these requirements, although meeting this requirement tends to interfere with the provision of active shielding as defined in the first requirement.

The present invention allows the designer to optimise the active shielding of the gradient coils, while allowing the reduction of Lorenz forces to be addressed relatively independently by the use of active force transducers as described above.

While the present invention has been described with reference to a limited number of particular embodiments, numerous variants and modifications will be apparent to those of skill in the relevant art. For example, combinations of different types of active force transducers may be used in any particular embodiment. Active force transducers may be placed at various axial locations, and need not be arranged in groups at a particular axial position. The active force transducers may be arranged to bear upon the gradient coil assembly at locations which corresponding to antinodes of certain resonant vibration frequencies of the gradient coil assembly. By placing the active force transducers 45 radially outside of primary superconducting coils 30, they do not require any enlarging of the magnet coil diameter, or reduction of the available patient bore diameter. Relatively large active force transducers 45 may be used, as the volume in which they may be located is not required for placement of other equipment. In certain embodiments, not all mechanical attachments 26 are provided with an active force transducer, but are simply rigid mechanical attachments.

I claim as my invention:

1. A cylindrical superconducting magnet system for use in magnetic resonance imaging, comprising:
    axially aligned primary superconducting coils, positioned within a vacuum vessel;
    a thermal radiation shield surrounding the primary superconducting coils, within the vacuum vessel;
    a gradient coil assembly aligned with the primary superconducting coils and located radially with respect to the primary superconducting coils;
    an assembly support, radially positioned outside of the primary superconducting coils and mechanically attached to the gradient coil assembly at a number of locations around the circumference of the gradient coil assembly, and at a number of axial locations along the gradient coil assembly, by radially-directed mechanical attachments that pass though through-holes through the vacuum vessel and the thermal radiation shield, and mechanically isolated from the vacuum vessel; and
    at least some of the mechanical attachments each comprising an active force transducer arranged to provide impulses of force onto a surface of the gradient coil assembly to oppose vibrations of the gradient coil assembly.

2. A cylindrical superconducting magnet system according to claim 1, wherein the mechanical attachments pass between adjacent primary superconducting coils, with the active force transducers positioned radially outside the primary superconducting coils.

3. A cylindrical superconducting magnet system according to claim 1 wherein an axial extension piece is attached to a surface of the gradient coil assembly, the mechanical supports and the associated active force transducers are positioned axially outside of the gradient coil assembly and the primary superconducting coils, such that the mechanical supports and their active force transducers act upon a surface of the extension piece, which is attached to a surface of the gradient coil assembly.

4. A cylindrical superconducting magnet system according to claim 1, wherein the active force transducers are constructed of non-magnetic materials.

5. A cylindrical superconducting magnet system according to claim 1 wherein the active force transducers comprise piezoelectric elements.

6. A cylindrical superconducting magnet system according to claim 1 wherein the active force transducers are pneumatically operable.

7. A cylindrical superconducting magnet system according to claim 1 wherein the active force transducers are hydraulically operable.

8. A cylindrical superconducting magnet system according to claim 1, wherein the active force transducers are connected for activation in accordance with signals generated by a magnet controller in response to signals generated by sensors indicating vibration of the gradient coil assembly.

9. A cylindrical superconducting magnet system according to claim 1, wherein the active force transducers are connected for activation in accordance with signals generated by a power supply that generates alternating currents for application to the gradient coils.

10. A cylindrical superconducting magnet system according to claim 1, wherein the active force transducers are connected for activation in accordance with results of a computer-implemented simulation predicting vibration of the gradient coil assembly.

11. A cylindrical superconducting magnet system according to claim 1, wherein the holes in the vacuum vessel are sealed by radially-directed tubes extending between a bore tube of the vacuum vessel and the recess, and in which the mechanical attachments pass through the tubes.

12. A cylindrical superconducting magnet system according to claim 10, wherein the holes in the thermal radiation shield are sealed by radially-directed tubes extending coaxially with the tubes sealing the vacuum vessel.

13. A cylindrical superconducting magnet system according to claim 1 wherein the assembly support comprises two annular structures, each mechanically attached to the gradient coil assembly near axial extremities thereof.

14. A cylindrical superconducting magnet system according to claim 13, wherein the vacuum vessel comprises a bore tube, an outer cylindrical wall and annular end pieces, both end pieces having a respective re-entrant portion defining a respective recess, and a respective annular structure is positioned within each recess.

15. A cylindrical superconducting magnet system according to claim 13 wherein the mechanical support assembly comprises an annular support ring positioned axially partially outside of the primary superconducting coils and the vacuum vessel.

16. A cylindrical superconducting magnet system according to claim 1 wherein the vacuum vessel and its contents are supported on a support surface, and the gradient coil assembly and the associated mechanical support assembly are supported on the support surface independently of the vacuum vessel and its contents.

17. A cylindrical superconducting magnet system according to claim 1, further comprising a cryogen vessel housing the primary magnet coils, such that the thermal radiation shield surrounds the cryogen vessel, within the vacuum vessel.

18. A cylindrical superconducting magnet system according to claim 1, further comprising axially-directed mechanical attachments, mechanically linked to the assembly support, at least some of which each comprise an active force transducer.

19. A cylindrical superconducting magnet system according to claim 1, wherein the gradient coil assembly is enclosed within the vacuum vessel.

20. A method for reducing vibration in a gradient coil assembly of a cylindrical superconducting magnet system for use in magnetic resonance imaging, comprising:
  providing a gradient coil assembly axially aligned with primary superconducting coils located within a vacuum vessel and located radially with respect to the primary superconducting coils,
  providing an assembly support, radially positioned outside of the primary superconducting coils and mechanically attached to the gradient coil assembly at a number of locations around the circumference of the gradient coil assembly, and at a number of axial locations along the gradient coil assembly, by radially-directed mechanical attachments that pass though through-holes through the vacuum vessel and the thermal radiation shield, and mechanically isolated from the vacuum vessel, wherein at least some of the mechanical attachments each comprise an active force transducer positioned radially outside the primary superconducting coils; and
  operating the active force transducers to provide impulses of force onto a surface of the gradient coil assembly to oppose vibrations of the gradient coil assembly.

21. A method according to claim 20, comprising positioning active force transducers radially outside the vacuum vessel, and further comprising removing one of the active force transducers, located radially outside of the vacuum vessel, and replacing it with another active force transducer, without the need to warm the magnet to room temperature.

22. A method according to claim 21 comprising implementing removal of an active force transducer and replacement thereof with another active force transducer are carried out with the magnet at field.

23. A method according to claim 20, further comprising attaching an axial extension piece to a surface of the gradient coil assembly; and
  positioning the mechanical supports and the associated active force transducers axially outside of the gradient coil assembly and the primary superconducting coils, such that the mechanical supports and their active force transducers act upon a surface of the extension piece, which is attached to a surface of the gradient coil assembly.

24. A method according to claim 20, comprising activating the active force transducers in accordance with signals generated by a magnet controller in response to signals generated by sensors indicating vibration of the gradient coil assembly.

25. A method according to claim 20, comprising activating the active force transducers in accordance with signals generated by a power supply that generates alternating currents for application to the gradient coils.

26. A method according to claim 20, comprising activating the active force transducers in accordance with results of a computer-implemented simulation predicting vibration of the gradient coil assembly.

27. A method according to claim 20, further comprising providing axially-directed mechanical attachments, mechanically linked to the assembly support, at least some of which each comprise an active force transducer operated to provide impulses of force onto a surface of the gradient coil assembly to oppose vibrations of the gradient coil assembly.

* * * * *